United States Patent [19]

Bouley

[11] 4,025,148

[45] May 24, 1977

[54] SOCKET FOR BLADE-TYPE ELECTRICAL CONTACTS

[75] Inventor: Jean-Claude Bouley, Dole, France

[73] Assignee: Bunker Ramo Corporation, Oak Brook, Ill.

[22] Filed: Nov. 3, 1975

[21] Appl. No.: 628,456

[30] Foreign Application Priority Data

Aug. 29, 1975 France .............................. 75.26663

[52] U.S. Cl. ..................... 339/176 MP; 339/17 CF; 339/258 T

[51] Int. Cl.² ...................... H01R 9/14; H05K 1/10

[58] Field of Search ...... 339/17 C, 17 CF, 176 MP, 339/95 R, 95 D, 217 S, 220 R, 221 R, 256 R, 258 T, 276 R

[56] References Cited

UNITED STATES PATENTS

| | | | |
|---|---|---|---|
| 3,634,879 | 1/1972 | Longenecker et al. .... | 339/17 CF X |
| 3,786,401 | 1/1974 | Jones et al. .................. | 339/95 X |

Primary Examiner—Roy Lake
Assistant Examiner—E. F. Desmond
Attorney, Agent, or Firm—William Lohff; F. M. Arbuckle

[57] ABSTRACT

An improved socket for blade-type electrical contacts which is simple to manufacture, has a high degree of electrical contact reliability and mechanical retention strength, and yet is small in comparison with prior art sockets. The socket is preferably affixed to a printed circuit board, either directly or by means by an intermediate mounting plate for receiving the contact pins of a standard DIP circuit element. In the printed circuit board or intermediate mounting plate, bores are provided in which the contact sockets are inserted. The sockets are prevented from rotation within the bore by crimping the socket and soldering it to the conductor side of the printed circuit board. Each contact socket has an entry end for receiving a blade-type contact pin and an opposite end remote from the entry end. The socket is in the form of an elongated tube with a constriction formed between its ends, the constriction having a configuration complementary to the shape of the contact pin but rotated at an angle relative to the orientation of an inserted pin, thereby effecting a retentive torqueing force between the socket and the pin at the area of constriction. When used with a standard DIP circuit element, each row of sockets has an elongated rectangular cross section at the constriction point oriented at an acute angle with respect to a plane passing through the row of sockets. The angles of orientation of the constricted areas in one row of sockets is opposite that of the other row.

11 Claims, 8 Drawing Figures

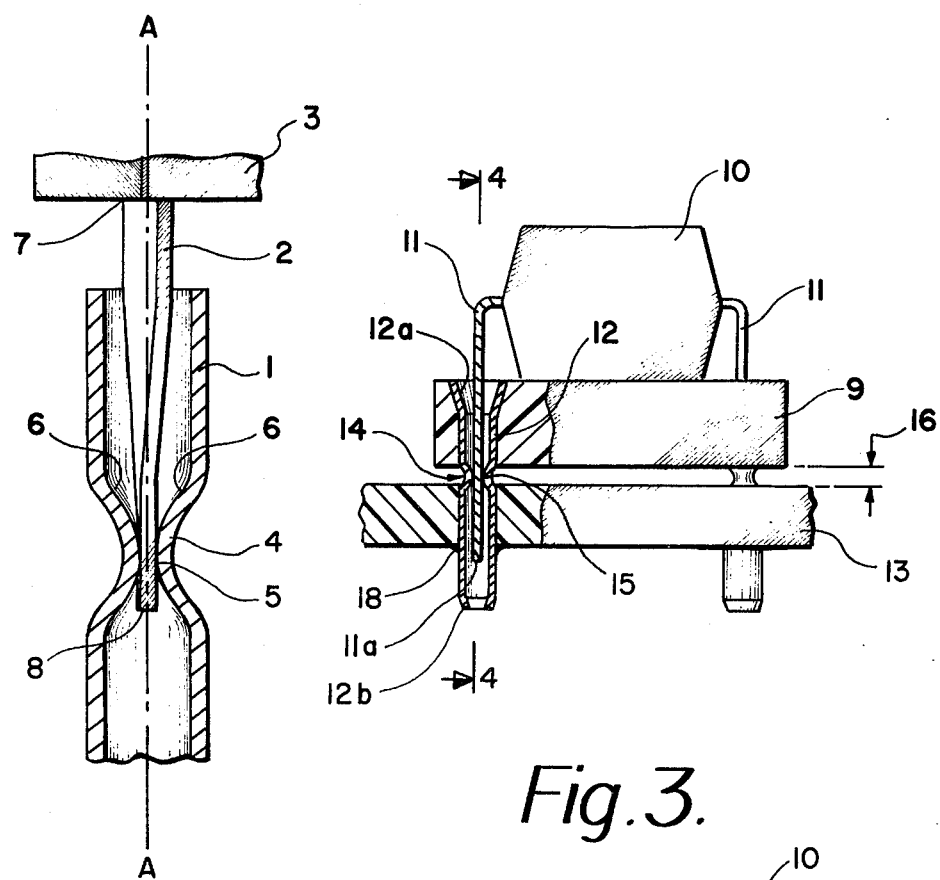
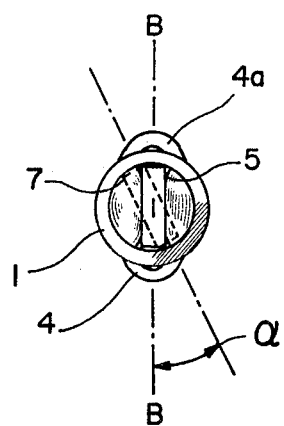
Fig.1.
Fig.2.
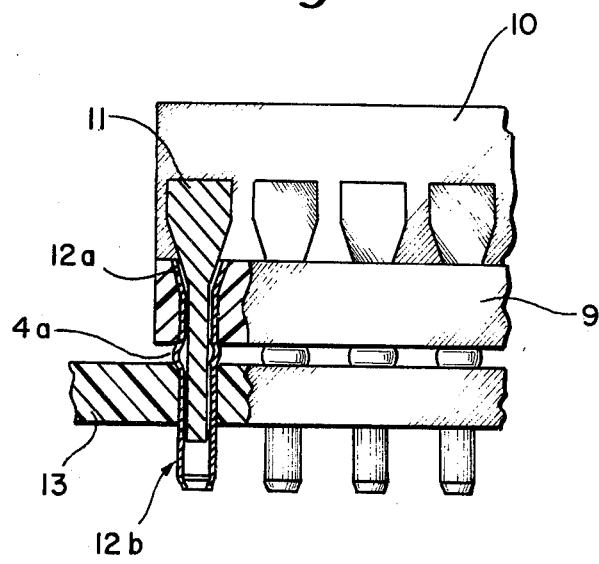
Fig.3.
Fig.4.

SOCKET FOR BLADE-TYPE ELECTRICAL CONTACTS

BACKGROUND OF THE INVENTION

1. Field of the Invention

The field of art to which the invention pertains includes the field of connecting blade-type contact pins to receiving sockets, and in particular the invention concerns a small but reliable socket arrangement for standard DIP circuit elements mounted on printed circuit boards.

2. Description of the Prior Art

In the manufacture, assembly, and servicing of computers, radio and tele-communication apparatuses, etc., many multi-contact connections are necessary. Many of these connections require non-permanent, releasable electrical connection, and in computer circuits in particular, several circuit elements, including integrated circuits, must be connected by making electrical contact between a plurality of pins on an integrated circuit element and the conductor strips of a mother printed circuit board.

In order to make connections with such circuits, the circuit packages are either soldered directly to a printed circuit board, or plugged into an intermediate multi-contact socket. In the latter instance, the socket ends themselves are soldered to the openings in a printed circuit board.

Sockets for integrated circuit DIP elements have a major disadvantage in that, in order to possess good electrical contact reliability and mechanical retention strength, the sockets must have strong spring elements bearing against the pins of the DIP element, and this requires considerable space between the DIP element and the printed circuit board. In particular, good electrical contact is possible only using large dimensional spring elements and large diameter sockets for positioning the spring elements. Accordingly, in order that there might be sufficient frictional engagement with the pin and good electrical contact, the sockets must, of necessity, have undesirably large length and diameter dimensions. Such requirements undesirably increase the space between the circuit element and the printed circuit board and decrease the number of possible connections on the mother printed circuit board.

An additional disadvantage of prior art sockets of this type is their cost. In order to attain high contact reliability, expensive spring elements must be utilized. Alternatively, in order to avoid the high cost of production, a manufacturer may do away with a spring in the socket, but in doing so he must provide an excessively long socket to insure good electrical contact somewhere along its length. Accordingly, the need exists for an improved socket for integrated circuits and the like which is simple and inexpensive to manufacture and requires little space between the circuit element and the printed circuit board.

SUMMARY OF THE INVENTION

It is an object of this invention to provide an inexpensive, yet reliable socket for receiving a blade-type contact pin.

A further object of the invention is to provide a socket of the above-mentioned type which serves to effect a torqueing action on the inserted pin in order to provide improved contact reliability and mechanical retention strength.

It is yet a further object of the invention to provide a contact socket of the above type which is small in size and which can be affixed to a printed circuit board directly or to an intermediate insulating mounting plate which in turn is mounted on a printed circuit board.

The present invention provides an effective socket arrangement for receiving pins of complementary form, the length and diameter of the socket allowing for true miniaturization of the connections, while insuring a high degree of electrical contact reliability and mechanical retention strength of the electrical connections.

According to the invention, a plurality of sockets are provided to receive the pins of a DIP element. Each socket is comprised of an elongated tube, the inside bore of which has a form that imposes a torqueing action on the inserted pin as the pin is inserted into the tube, the socket being maintained in a fixed angular position relative to a body of insulating material upon which it is fixed.

While the above and following discussion primarily is directed to the use of the subject invention in connection with the pins of a DIP circuit element, it is to be understood that any blade-type electrical contact pin in which the pin is restrained against rotational movement can be used in combination with the invention according to the subject application in a beneficial manner.

To effect the torqueing action, each socket is in the form of an elongated cylinder, generally circular in shape except for at least one constriction formed between the ends of the socket and having a configuration complementary to the shape of a contact pin to be inserted therein, but oriented at an angle relative to the orientation of an inserted pin, thereby effecting a retentive torqueing force between the socket and pin at the constriction.

In a preferred embodiment, the constriction has a rectangular cross section in a plane normal to the axis of the tube and is symetrical about the axis of the tube. Since the normal shape of an inserted contact pin is, in cross section, an elongated rectangle, the constriction is preferably of elongated rectangular cross section having a longitudinal axis at an acute angle with respect to the longitudinal axis of the rectangular cross section of an untorqued pin of the DIP element. Additionally, the axis of the rectangular cross section of each socket is at an acute angle to a plane passing through the row of sockets arranged to receive the pins of a DIP element. The orientation of the longitudinal axis of the rectangular cross section of each socket in the other row of contacts for the DIP element is equal but opposite that of the first row.

Major advantages of a device made in accordance with the invention reside in the fact that the elastic torque acting on the pin at the point of constriction assures an absolutely reliable electrical contact, and at the same time provides important mechanical retention strength.

Additionally, since the electrical contact is made due to the torqueing action on the inserted pin, the frictional engagement and contact reliability is not dependent upon the length of the socket, thereby allowing for a very short socket length and simultaneously making efficient use of the available space for the circuit components.

Another factor effecting miniaturization of the circuit components utilizing the present invention resides in the fact that the diameter of the socket is not a function of the desired contact reliability, since it is only necessary for the socket to be dimensionally only slightly larger than the contact pin itself.

Finally, the manufacturing cost of such a socket and its assembly into a printed circuit board or intermediate mounting plate is particularly low. A socket of the prescribed type can be produced by known cutting and stamping operations, and the simplicity of the socket results in an extremely reduced number of manufacture operations as compared with spring-type prior art sockets. From a material treating standpoint, the contact surfaces to be treated are small, and may only superficially be treated or not treated at all.

The small diameter dimension of the sockets in accordance with the present invention makes it possible to fasten them directly in the standard size holes in printed circuit boards normally provided for standard DIP pins or the pins of an associated standard DIP socket.

BRIEF DESCRIPTION OF THE DRAWINGS

The invention will now be described in detail with reference to the accompanying drawings representing preferred embodiments of a socket for blade-type electrical contact pins according to the present invention. In the drawings:

FIG. 1 is a cross-sectional view of a socket according to the invention, and a cross-sectional view of an inserted blade-type contact pin;

FIG. 2 is a top view of the socket of FIG. 1;

FIG. 3 is an elevational view of a connection between the pins of a DIP circuit element and a socket according to the present invention;

FIG. 4 is a profile view of FIG. 3 with a partial cross-section, taken along the lines 4—4 of FIG. 3;

DETAILED DESCRIPTION OF THE PREFERRED EMBODIMENTS

Figure 5:
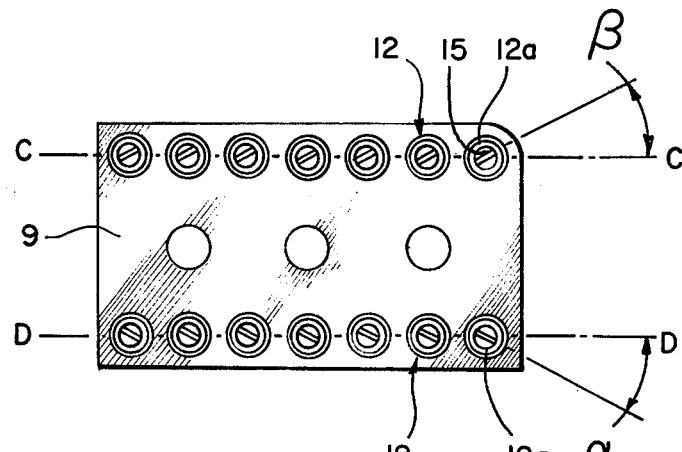
FIG. 5 is a plan view of an intermediate mounting insulating plate having multiple sockets mounted thereon.

FIG. 1 shows the basic socket construction wherein a contact socket 1 has a constriction 4 sized to matingly receive the end 8 of a blade-type contact pin 2 projecting from a support 3. Both the support 3 and the socket 1 are mounted in a manner to resist rotation.

At the point of contact with the pin 2, constriction 4 has a rectangular cross section shown at 5 in the drawing. The rectangular cross section 5 is oriented at an acute angle with respect to the configuration of the pin base 7 as it projects from support 3. Upon insertion (downwardly in FIG. 1) of pin 2 into the socket 1, the ramped edges 6 cause the end 8 of pin 2 to twist slightly in order to allow pin 2 to fit into the rectangular constriction 4. This may be better observed by reference to FIG. 2, wherein the pin base 7 is shown to be angularly displaced with respect to the rectangular section 5 of constriction 4 by an angle α.

The rectangular section 5 of constriction 4 is produced by crimping or otherwise compressing a portion of the cylindrical tube constituting socket 1 along an axis B—B (FIG. 2) perpendicular to the axis AA (FIG. 1) of socket 1. The socket is initially in the form of a cylindrical tube with a circular cross section, and the crimping of the tube forming constriction 4 inherently produces two ramps 6 which facilitate the penetration of pin 2 at its end 8 through the constriction 4.

So long as means are provided for restraining rotation of the support 3 and socket 1, a torque is imposed on an inserted pin 2 made possible by its own elasticity. The friction which results from the torqueing of the pin assures reliability of the electrical contact, and at the same time provides good mechanical retention of the pins in the socket.

FIGS. 3 and 4 show a manner of supporting an integrated circuit on a printed circuit board using the connector socket accoring to the present invention. In the drawing of FIGS. 3 and 4, there is shown a standard DIP circuit element adapted to be mounted on a printed circuit board 13 by means of an intermediate mounting insulating plate 9. The socket 12 is secured against rotation in intermediate plate 9 and is subsequently affixed to the printed circuit board by applying solder at terminal point 18. It will be appreciated that, if desired, the DIP circuit element can be attached directly to a printed circuit board by means of the socket according to the invention without the necessity of an intermediate mounting plate 9 (see FIG. 8).

Note should be made of the fact that FIGS. 3 and 4 are intended to illustrate primarily the manner in which a DIP element can be attached ultimately to a printed circuit board, and the details of the twisted pin in the socket are not shown for simplifying the drawings of FIGS. 3 and 4. It is to be understood, however, that the pins shown in FIGS. 3 and 4 inserted in their respective sockets are normally twisted and posses the desired torqueing qualities.

In order to illustrate a preferred embodiment of the socket 1 according to FIG. 1, new reference numerals have been given the various structural parts of the socket of FIGS. 3 and 4 wherein important modifications of the basic structure of FIG. 1 are employed.

As best seen in FIG. 3, a small intermediate mounting plate 9 of insulating material is provided with sockets 12 in number and position to correspond to the pins 11 of the support body 10 of the illustrated DIP integrated circuit element.

The inside diameter of the sockets 12 is only slightly greater than the width of the pins 11, and the outside diameter of the pins may be small enough to pass readily through the holes of a printed circuit board 13, wherein the holes provided are of standard size for the industry. Thus, the socket 12 can be beneficially utilized to provide a releaseable but reliable electrical connection with an integrated circuit element without the necessity of modifying the printed circuit boards to receive the sockets.

The upper end 12a of socket 12 is widened or flanged in such a way as to facilitate insertion of pins 11. The flanged upper end 12a serves to aid in preventing rotation of the socket within plate 9. The retention of socket 12 in plate 9 is enhanced by the precise positioning of constriction 14 at the underside of plate 9, and when properly positioned effects a clamping action between the flanged upper end 12a of the socket and the constriction 14. Additional insurance against rotation of the socket is had by soldering the lower end 12a of socket 12 at terminal point 18 on the underside of the printed circuit board 13. In the examples shown in the drawing, rotational restraint of the pins is automatically accomplished by the provision of several pins along the side edges of the DIP element. However, when a single blade-type pin is to be used, some means is provided for preventing rotation, such as guide keys (not shown) on the connector housing which maintains a prescribed rotational orientation of the connector (and thus the pin) with respect to the socket.

FIG. 5 shows a plan view of two rows of sockets 12 on support plate 9. As viewed in FIG. 5, the constrictions are of elongated rectangular cross section with each longitudinal axis of the rectangular cross section being at an acute angle to a plane passing through the row of sockets. The left hand row of sockets along axis C—C in FIG. 5 have their constrictions all parallel with each other and oriented at an angle $\beta$ with respect to axis C—C. The right hand row of contacts along axis D—D, on the other hand, have their restrictions all parallel with one another and at an equal but opposite angle $\alpha$ with respect to axis D—D.

Referring now to FIGS. 3 and 4 in particular, the constriction 14 of sockets 12 results in an expanding of the area about the constriction in one direction (FIG. 4) and a narrowing of the area at the constriction in a normal direction thereto (FIG. 3). The expanded portion appears as a bulge 4a (FIG. 4) which serves as a spacer between intermediate plate 9 and printed circuit board 13 leaving a small space 16 between the plate and the board. The space 16 facilitates cleaning of the assembly after soldering of the extremities 12b, and in addition allows for ventilation of the circuits situated on top of printed circuit board 13.

Figures 6, 7:
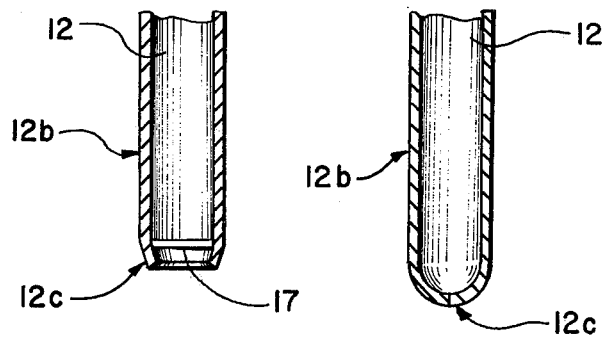
FIG. 6 is a cross-sectional view of the end of the socket.
FIG. 7 is a variant of FIG. 6.

FIGS. 6 and 7 show that the sockets 12 may be closed off at their extremities 12c. This is done to avoid the possibility of solder entering the end of socket 12 which would clog the opening within the socket and prevent insertion of pins 11. It is especially important to close off the extremity 12c when high production solder baths are used.

FIG. 6 shows a closing off of the extremity 12c by a stopper 17. The stopper 17 is fixed in position by curving the edges of extremity 12c inwardly to encase the stopper. Stopper 17 is designed to remain in place under the maximum heating temperatures during the soldering step. The curved edges of extremity 12c facilitate the positioning of socket 12 through the apertures in printed circuit board 13 and/or those in intermediate plate 9.

FIG. 7 shows an alternative method of forming the extremity 12c of socket 12 by a process of hemispheric stamping of the extremity. In the arrangement, no stopper is required, and the curved edges serve the dual purpose of closing off the end socket 12 while providing a camming surface for facilitating positioning of the socket through the holes in printed circuit board 13.

Figure 8:
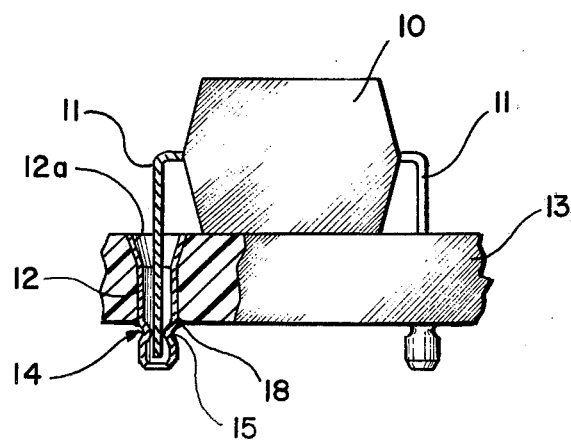
FIG. 8 is a view similar to that of FIG. 3 but without an intermediate mounting plate.

The arrangement in FIG. 8 is similar to that shown in FIG. 3 with the exception that the intermediate plate 9 is omitted. In such an arrangement, sockets 12 are designed to have a length only slightly greater than the thickness of printed circuit board 13, and the sockets are placed directly in standard holes in the boards. As before, the socket 12 is prevented from rotation by the clamping action offered by flanged upper end 12a working against constriction 14 on either side of printed circuit board 13. Additionally, the area of constriction emerging from the lower side of printed circuit board 13 can be soldered at terminal point 18 to simultaneously make electrical connection with the printed circuit conductors and aid in fixing the orientation angle of the socket on the board. This embodiment of the invention makes it possible to make even more efficient use of the available space. The height gained in such an arrangement is the distance between the lower extremity 11a of pin 11 and the lower extremity 12c (FIG. 3) of the socket. This latter arrangement produces a very compact assembly of stacked printed circuit cards and makes maximum use of the available space. As can be appreciated, the limiting factor in such an arrangement is the length of the pins 11 themselves, the sockets adding no additional height dimension to the assembly.

From the foregoing, it can be readily realized that this invention can assume various embodiments. Thus, it is to be understood that the invention is not limited to the specific embodiments described herein, but is to be limited only by the appended claims.

The embodiments of the invention in which an exclusive property or privilege is claimed are defined as follows:

1. A socket for blade-type electrical contact pins, wherein the pins are restrained against rotational movement, said socket comprising:
   an insulating support plate having a bore therethrough;
   a least one contact socket in said bore, said socket having an entry end for receiving a blade-type contact pin and an opposite end remote from said entry end; and
   means for preventing rotation of said socket in said bore;
   said contact being in the form of an elongated tube including a tube wall with an inner surface and a constriction formed in said tube wall between said ends, said constriction constituted by a continuous portion of said inner surface and having a configuration complementary to the shape of the contact pin but oriented at an angle relative to the orientation of an inserted pin, thereby effecting a retentive torqueing force between said socket and pin at said constriction.

2. The socket as claimed in claim 1, wherein said opposite end of said socket is closed.

3. The socket as claimed in claim 1, wherein said means for preventing rotation includes a solder connection at said opposite end.

4. The socket as claimed in claim 1, wherein said support plate is a printed circuit board.

5. The socket as claimed in claim 1, wherein said support plate is an intermediate insulating member with said opposite end of said socket projecting outwardly from said insulating member and engaged in a second bore in a printed circuit board, said constriction positioned between the adjacent facing surfaces of said insulating member and said printed circuit board.

6. A socket for blade-type rectangular cross section electrical contact pins, wherein the pins are restrained against rotational movement, said socket comprising:
   an insulating support plate having a bore therethrough;
   at least one contact socket in said bore, said socket having an entry end for receiving a blade-type contact pin and an opposite end remote from said entry end; and
   means for preventing rotation of said socket in said bore;
   said socket being in the form of an elongated tube with a constriction formed between said ends, said tube having a generally circular cross section except for said constriction which has a rectangular cross section complementary to the cross-sectional shape of the contact pin in a plane normal to the axis of said tube and which is symmetrical about the axis of said tube and oriented at an angle relative to the orientation of an inserted pin thereby effecting a retentive torquing force between said socket and pin at said constriction.

7. The socket as claimed in claim 6, in combination with at least an additional one of said sockets forming a row of said sockets on said support plate, said constrictions being of elongated rectangular cross section with each longitudinal axis of said rectangular cross sections being at an acute angle to a plane passing through said row of sockets.

8. The socket as claimed in claim 7, in combination with at least two additional ones of said sockets forming a second row of said sockets on said support plate, said second row being parallel to said first row, said additional sockets having constrictions with elongated rectangular cross sections with each longitudinal axis of said rectangular cross sections of said additional sockets disposed at equal but opposite acute angles with respect to said plane passing through said row of sockets.

9. The socket as claimed in claim 8, wherein said longitudinal axes of said first row are parallel to each other, and said longitudinal axes of said second row are parallel to each other.

10. A socket for blade-type contact pins, wherein the pins are restrained against rotational movement, said socket comprising:

an insulating support plate having a bore therethrough;

at least one contact socket in said bore, said socket having an entry end for receiving a blade-type contact pin and an opposite end remote from said entry end, said opposite end having a sufficient length to pass through and make electrical connection with a printed circuit board; and means preventing rotation of said socket in said bore;

said socket being in the form of an elongated tube with a constriction formed between said ends, said constriction having a configuration complementary to the shape of the contact pin but oriented at an angle relative to the orientation of an inserted pin, thereby effecting a retentive torquing force between said socket and pin at said constriction.

11. A socket for blade-type electrical contact pins wherein the pins restrained against rotational movement, said socket comprising:

an insulating support plate having a bore therethrough;

at least one contact socket in said bore, said socket having an entry end for receiving a blade-type contact pin and an opposite end remote from said entry end; and means for preventing rotation of said socket in said bore;

said contact being in the form of an elongated tube with a constriction formed between said ends, said constriction having a configuration complementary to the shape of the contact pin but oriented at an angle relative to the orientation of an inserted pin, thereby effecting a retentive torquing force between said socket and pin at said constriction, said means for preventing rotation of said socket including a flanged portion at said entry end of said tube frictionally engaging the inner wall at one end of said bore, and a crimped portion adjacent said opposite end, said crimped portion simultaneously forming said constriction and effecting a clamping action of the crimped portion against said support plate adjacent the other end of said bore.

* * * * *